United States Patent
Öhgren

(10) Patent No.: US 11,728,556 B2
(45) Date of Patent: Aug. 15, 2023

(54) PHASE SEQUENCING THREE-PHASE NETWORK

(71) Applicant: RUAG SPACE AB, Gothenburg (SE)

(72) Inventor: Mikael Öhgren, Öjersjö (SE)

(73) Assignee: RUAG SPACE AB, Gothenburg (SE)

( * ) Notice: Subject to any disclaimer, the term of this patent is extended or adjusted under 35 U.S.C. 154(b) by 305 days.

(21) Appl. No.: 17/078,540

(22) Filed: Oct. 23, 2020

(65) Prior Publication Data

US 2021/0126336 A1 Apr. 29, 2021

(30) Foreign Application Priority Data

Oct. 24, 2019 (EP) .................................. 19204996

(51) Int. Cl.
*H01P 5/00* (2006.01)
*H01P 5/12* (2006.01)
*H01P 1/18* (2006.01)
*H01P 3/08* (2006.01)
*H03H 7/21* (2006.01)

(52) U.S. Cl.
CPC ................ *H01P 5/12* (2013.01); *H01P 1/184* (2013.01); *H01P 3/08* (2013.01); *H03H 7/21* (2013.01)

(58) Field of Classification Search
CPC ... H01P 5/12; H01P 1/184; H01P 3/08; H03H 17/21
See application file for complete search history.

(56) References Cited

U.S. PATENT DOCUMENTS

| 6,310,788 B1 | 10/2001 | Myer |
| 9,391,375 B1 * | 7/2016 | Bales ................... H01Q 21/064 |
| 2015/0002243 A1 | 1/2015 | Darwish et al. |

OTHER PUBLICATIONS

Extended European Search Report dated Apr. 14, 2020 for European Patent Application No. 19204996.3, 8 pages.
Xiaolong Wang et al; "A Planar Three-Way Dual-Band Power Divider Using Two Generalized Open Stub Wilkinson Dividers", Proceedings of Asia-Pacific Microwave Conference 2010, IEEE, Dec. 7, 2010, pp. 714-717 (4 pages).

* cited by examiner

*Primary Examiner* — Tuan T Lam
(74) *Attorney, Agent, or Firm* — Sage Patent Group

(57) ABSTRACT

The invention relates to a phase sequencing three-phase network comprising a first side connected to a second side via the network. The first side comprises one endpoint (EP1) and the second side comprises three endpoints (EP2, EP3, and EP4). The network comprises five nodes (NP1-NP5) interconnected via feed line sections (FP1-FP10) comprising at least one transmission line section (R11-R102) each. The invention further relates to an optimization method for the network for deciding characteristic impedance and length of each transmission line section (R11-R102).

8 Claims, 4 Drawing Sheets

PHASE SEQUENCING THREE-PHASE NETWORK

CROSS-REFERENCE TO RELATED APPLICATIONS

The present application for patent claims priority to European Patent Office Application Ser. No. 19204996.3, entitled "PHASE SEQUENCING THREE-PHASE NETWORK" filed on Oct. 24, 2019, assigned to the assignee hereof, and expressly incorporated herein by reference.

TECHNICAL FIELD OF THE INVENTION

The present disclosure relates to a phase sequencing three-phase network comprising a first side connected to a second side via the network. The invention also relates to a method for optimizing the network.

BACKGROUND

In the field of transmitting and receiving antennas, it is a desire to be able to choose bandwidth dependent on application. It is especially important to have a robust broad band solution for antennas in space since flexibility is desired.

SUMMARY OF THE INVENTION

An object of the present disclosure is to provide an improved antenna feed line that allows for a broadband feed network and that is robust.

Today, there are no existing broadband microwave three phasing network with phase and amplitude balance.

The present invention relates to a solution based on a feed network design that includes a transmission circuit that divides one input to three outputs. The outputs can have equal amplitude, but can also be arranged to have non-equal amplitude. Regardless of the amplitude the circuit has the advantage of being able to divide the phase angles essentially equally, i.e. substantially 120 degrees between the three end points.

The circuit is reciprocal so that it can use the three outputs as inputs and the one input as one output. In the following the one input/output is denoted first end point, and the three input/outputs are denoted second endpoint, third endpoint and fourth endpoint.

According to one example embodiment, the circuit is a phase sequencing three-phase network comprising a first side connected to a second side via the network, characterized in that the network comprises:
a first feed line section extending from a first end point to a first node,
a second feed line section extending from the first node to a second node,
a third feed line section extending from the second node to a second end point,
a fourth feed line section extending from the first node to a third node,
a fifth feed line section extending from the third node to a fourth node,
a sixth feed line section extending from the second node to a fifth node,
a seventh feed line section extending from the fifth node to the fourth node,
an eighth feed line section extending from the third node to the fifth node,
a ninth feed line section extending from the fifth node to a third end point,
a tenth feed line section extending from the fourth node to a fourth end point,
wherein the network comprises a first circuit comprising the first, second, fourth, fifth, sixth, seventh and eight feed line sections between the first endpoint and the second, fourth and fifth nodes and a second circuit comprising the third feed line section between the second node and the second end point, the ninth feed line section between the fifth node and the third end point and the tenth feed line section between the fourth node and the fourth end point,
wherein each feed line section in the first circuit and second circuit comprises one or more transmission line sections with a predetermined characteristic impedance and length.

This circuit has the advantage of providing a broadband feed network that is robust and especially suitable for space applications.

According to one example, the second circuit comprises transmission line sections with predetermined characteristic impedance for adjusting amplitude.

According to one example, the feed line section identified as representing the first phase in the second circuit serves as reference phase for phase shift on the remaining two feed line sections.

According to one example, the remaining two feed line sections have predetermined lengths with reference to the length of the transmission line section in the reference phase so that the phase angles are substantially 120 degrees between the second, third and fourth end points.

According to one example, the first side comprises the first end point and the second side comprises the second end point, the third end point and the fourth end point.

According to one example, the network can be used for both transmitting and receiving and in the transmitting mode the first side is a feeding side for feeding signals to the antenna for transmission via the second side, and in the receiving mode the second side is a receiving side for feeding signals to the first side.

According to one example, the first matching circuit (2) is not terminated.

According to one example, the phase sequencing three-phase network comprises only passive components.

The invention further relates to a method for optimizing a phase sequencing three-phase network according to any one of the examples above. The method comprises:
setting a phase and amplitude balance and reflection bandwidth specification on all four end points,
choosing characteristic impedance on each of the four end points,
for each of the third, ninth and tenth feed line sections, i.e. the three feed line section connected to the three input/output endpoints on the second side, setting characteristic impedance on the transmission line sections closest to their respective second, third and fourth endpoints to be the same as the characteristic impedance of the respective second, third and fourth endpoints, and
optimize all remaining transmission line sections to achieve the specification.

Optimizing a number of parameters in a circuit or network to give a desired output from an input signal is in itself known in prior art, but the topology of the described invention with a first side with one endpoint and a second side with three endpoints is not known in the radio frequency domain. The described invention gives a phase sequencing three-phase network with less resonance frequency problems than other today known applications.

According to one example, the method further comprises:
finding which of the third, ninth, and tenth feed line section is the first phase, and
using the identified feed line section as a reference phase and adjusting amplitude and phase on the other two feed line sections by optimizing characteristic impedance and length on the respective other two transmission line sections with relation to the characteristic impedance and length of the transmission line section of the identified feed line section.

In order to simplify further description of the invention the following denotations are introduced:
the first feed line section comprises a first transmission line section,
the second feed line section comprises a second transmission line section,
the third feed line section comprises a third transmission line section,
the fourth feed line section comprises a fourth transmission line section,
the fifth feed line section comprises a fifth transmission line section,
the sixth feed line section comprises a sixth transmission line section,
the seventh feed line section comprises a seventh transmission line section,
the eighth feed line section comprises an eighth transmission line section,
the ninth feed line section comprises a ninth transmission line section, and
the tenth feed line section comprises a tenth transmission line section.

Here, it should be noted that each feed line section may comprise one or more transmission line sections.

According to the following examples:
the first transmission line section comprises two transmission line sections hereinafter denoted R11, with a characteristic impedance denoted Z0 and a length denoted L0, and R12, with a characteristic impedance denoted Z1 and a length denoted L1,
the second transmission line section comprises one transmission line section hereinafter denoted R21 with a characteristic impedance denoted Z2 and a length denoted L2,
the third transmission line section comprises two transmission line sections hereinafter denoted R31, with a characteristic impedance denoted Z8 and a length denoted L8, and R32, with a characteristic impedance denoted Z11 and a length denoted L11,
the fourth transmission line section comprises one transmission line section hereinafter denoted R41, with a characteristic impedance denoted Z3 and a length denoted L3,
the fifth transmission line section comprises one transmission line section hereinafter denoted R51, with a characteristic impedance denoted Z5 and a length denoted L5,
the sixth transmission line section comprises one transmission line section hereinafter denoted R61, with a characteristic impedance denoted Z6 and a length denoted L6,
the seventh transmission line section comprises one transmission line section hereinafter denoted R71, with a characteristic impedance denoted Z7 and a length denoted L7,
the eighth transmission line section comprises one transmission line section hereinafter denoted R81, with a characteristic impedance denoted Z4 and a length denoted L4,
the ninth transmission line section comprises two transmission line sections hereinafter denoted R91, with a characteristic impedance denoted Z9 and a length denoted L9, and R92 with a characteristic impedance denoted Z11 and a length denoted L12, and
the tenth transmission line section comprises two transmission line sections hereinafter denoted R101, with a characteristic impedance denoted Z10 and a length denoted L10, and R102 with a characteristic impedance denoted Z11 and a length denoted L13.

In this example and with reference to the above, it is the transmission line section R11 that is that is closest to the first endpoint; the transmission line section R32 that is closest to the second endpoint; the transmission line section R92 that is closest to the third endpoint; and the transmission line section R102 that is closest to the fourth endpoint.

As mentioned above, each of the transmission line sections are associated to a characteristic impedance and a length. Choosing the correct characteristic impedances and length of the transmission line sections, Z0 to Z11 and L0 to L13, will result in a broadband feed network. There are several combinations of the parameters Z0 to Z11 and L0 to L13 that leads to good results.

Choosing the following parameters for Z0 to Z11 and L1 to L13 gives a beneficial example of the invention with a broad bandwidth, equal amplitudes and three phases divided equally around 360 degrees, i.e. 0, 120 and 240 degrees. The length L is given as electrical length in degrees at the center frequency. In this example the input and output characteristic impedance is 50 Ohm.

R11: Z0=50 Ohm and L0=10 degree,
R12: Z1=50 Ohm and L1=10 degree,
R21: Z2=100 Ohm and L2=62 degree,
R41: Z3=40 Ohm and L3=106 degree,
R81: Z4=55 Ohm and L4=169 degree,
R51: Z5=40 Ohm and L5=171 degree,
R61: Z6=45 Ohm and L6=140 degree,
R71: Z7=100 Ohm and L7=87 degree,
R31: Z8=70 Ohm and L8=125 degree,
R91: Z9=30 Ohm and L9=29 degree,
R101: Z10=35 Ohm and L10=149 degree,
R32: Z11=50 Ohm and L11=9 degree,
R92: Z11=50 Ohm and L12=50 degree,
R102: Z11=50 Ohm and L13=28 degree.

Below are further examples of how the components can be matched in order to achieve a phase sequencing three-phase network where the phase angles are substantially 120 degrees between the second, third and fourth end points EP2, EP3 and EP4.

In the following table each column represents an example and there are nine examples, i.e. example Ex. 1 to Ex. 9.

|    | Ex. 1 | Ex. 2 | Ex. 3 | Ex. 4 | Ex. 5 | Ex. 6 | Ex. 7 | Ex. 8 | Ex. 9 |
|----|-------|-------|-------|-------|-------|-------|-------|-------|-------|
| Z0 | 50    | 50    | 50    | 50    | 50    | 50    | 50    | 50    | 50    |
| Z1 | 50    | 50    | 50    | 50    | 50    | 50    | 50    | 50    | 50    |
| Z2 | 100   | 50    | 64    | 100   | 70    | 50    | 48    | 53    | 99    |
| Z3 | 54    | 100   | 79    | 61    | 47    | 78    | 95    | 97    | 45    |

-continued

|     | Ex. 1 | Ex. 2 | Ex. 3 | Ex. 4 | Ex. 5 | Ex. 6 | Ex. 7 | Ex. 8 | Ex. 9 |
| --- | --- | --- | --- | --- | --- | --- | --- | --- | --- |
| Z4  | 52 | 56 | 100 | 99 | 99 | 62 | 100 | 60 | 40 |
| Z5  | 79 | 30 | 48 | 100 | 98 | 86 | 30 | 37 | 100 |
| Z6  | 89 | 30 | 35 | 39 | 100 | 30 | 30 | 32 | 68 |
| Z7  | 36 | 100 | 56 | 30 | 55 | 100 | 58 | 98 | 39 |
| Z8  | 75 | 87 | 77 | 74 | 82 | 87 | 100 | 99 | 67 |
| Z9  | 53 | 85 | 81 | 30 | 42 | 86 | 100 | 100 | 53 |
| Z10 | 98 | 43 | 43 | 33 | 38 | 30 | 43 | 32 | 100 |
| Z11 | 50 | 50 | 50 | 50 | 50 | 50 | 50 | 50 | 50 |
| L0  | 10 | 10 | 10 | 10 | 10 | 10 | 10 | 10 | 10 |
| L1  | 10 | 10 | 10 | 10 | 10 | 10 | 10 | 10 | 10 |
| L2  | 130 | 72 | 52 | 94 | 147 | 58 | 72 | 68 | 99 |
| L3  | 74 | 113 | 112 | 199 | 38 | 100 | 106 | 113 | 84 |
| L4  | 200 | 173 | 154 | 48 | 38 | 160 | 155 | 166 | 200 |
| L5  | 60 | 51 | 23 | 126 | 163 | 13 | 35 | 41 | 60 |
| L6  | 139 | 200 | 199 | 125 | 123 | 184 | 186 | 182 | 136 |
| L7  | 200 | 80 | 134 | 21 | 32 | 133 | 135 | 122 | 200 |
| L8  | 70 | 174 | 167 | 136 | 200 | 178 | 172 | 171 | 105 |
| L9  | 123 | 170 | 166 | 45 | 76 | 172 | 171 | 170 | 148 |
| L10 | 16 | 70 | 28 | 179 | 174 | 19 | 99 | 10 | 13 |
| L11 | 144 | 115 | 115 | 18 | 192 | 102 | 110 | 109 | 156 |
| L12 | 50 | 50 | 50 | 50 | 50 | 50 | 50 | 50 | 50 |
| L13 | 80 | 45 | 102 | 25 | 79 | 119 | 38 | 110 | 108 |

In the following table each column represents an example and there are nine examples, i.e. example Ex. 1 to Ex. 9. Some of the characteristic impedances Z and the lengths L are expressed as an interval. Hence, in this example some of the characteristic impedances and lengths are set to predetermined numbers, while other characteristic impedances and lengths are set to intervals.

|     | Ex. 1 | Ex. 2 | Ex. 3 | Ex. 4 | Ex. 5 | Ex. 6 | Ex. 7 | Ex. 8 | Ex. 9 |
| --- | --- | --- | --- | --- | --- | --- | --- | --- | --- |
| Z0  | 50 | 50 | 50 | 50 | 50 | 50 | 50 | 50 | 50 |
| Z1  | 50 | 50 | 50 | 50 | 50 | 50 | 50 | 50 | 50 |
| Z2  | 100 | 30-100 | 30-100 | 30-100 | 30-100 | 30-100 | 30-100 | 30-100 | 30-100 |
| Z3  | 30-100 | 100 | 30-100 | 30-100 | 30-100 | 30-100 | 30-100 | 30-100 | 30-100 |
| Z4  | 30-100 | 30-100 | 100 | 30-100 | 30-100 | 30-100 | 30-100 | 30-100 | 30-100 |
| Z5  | 30-100 | 30-100 | 30-100 | 100 | 30-100 | 30-100 | 30-100 | 30-100 | 30-100 |
| Z6  | 30-100 | 30-100 | 30-100 | 30-100 | 100 | 30-100 | 30-100 | 30-100 | 30-100 |
| Z7  | 30-100 | 30-100 | 30-100 | 30-100 | 30-100 | 100 | 30-100 | 30-100 | 30-100 |
| Z8  | 30-100 | 30-100 | 30-100 | 30-100 | 30-100 | 30-100 | 100 | 30-100 | 30-100 |
| Z9  | 30-100 | 30-100 | 30-100 | 30-100 | 30-100 | 30-100 | 30-100 | 100 | 30-100 |
| Z10 | 30-100 | 30-100 | 30-100 | 30-100 | 30-100 | 30-100 | 30-100 | 30-100 | 100 |
| Z11 | 50 | 50 | 50 | 50 | 50 | 50 | 50 | 50 | 50 |
| L0  | 10 | 10 | 10 | 10 | 10 | 10 | 10 | 10 | 10 |
| L1  | 10 | 10 | 10 | 10 | 10 | 10 | 10 | 10 | 10 |
| L2  | 10-200 | 10-200 | 10-200 | 10-200 | 10-200 | 10-200 | 10-200 | 10-200 | 10-200 |
| L3  | 10-200 | 10-200 | 10-200 | 10-200 | 10-200 | 10-200 | 10-200 | 10-200 | 10-200 |
| L4  | 10-200 | 10-200 | 10-200 | 10-200 | 10-200 | 10-200 | 10-200 | 10-200 | 10-200 |
| L5  | 10-200 | 10-200 | 10-200 | 10-200 | 10-200 | 10-200 | 10-200 | 10-200 | 10-200 |
| L6  | 10-200 | 10-200 | 10-200 | 10-200 | 10-200 | 10-200 | 10-200 | 10-200 | 10-200 |
| L7  | 10-200 | 10-200 | 10-200 | 10-200 | 10-200 | 10-200 | 10-200 | 10-200 | 10-200 |
| L8  | 10-200 | 10-200 | 10-200 | 10-200 | 10-200 | 10-200 | 10-200 | 10-200 | 10-200 |
| L9  | 10-200 | 10-200 | 10-200 | 10-200 | 10-200 | 10-200 | 10-200 | 10-200 | 10-200 |
| L10 | 10-200 | 10-200 | 10-200 | 10-200 | 10-200 | 10-200 | 10-200 | 10-200 | 10-200 |
| L11 | 10-200 | 10-200 | 10-200 | 10-200 | 10-200 | 10-200 | 10-200 | 10-200 | 10-200 |
| L12 | 50 | 50 | 50 | 50 | 50 | 50 | 50 | 50 | 50 |
| L13 | 10-200 | 10-200 | 10-200 | 10-200 | 10-200 | 10-200 | 10-200 | 10-200 | 10-200 |

The transmission line sections can be made from one type of transmission line or a combination of different types. The transmission line can for example be a stripline, microstrip, coaxial cable or a waveguide.

BRIEF DESCRIPTION OF FIGURES

The disclosure will be described in greater detail in the following, with reference to the attached drawings, in which.

DESCRIPTION OF EXAMPLE EMBODIMENTS

Various aspects of the disclosure will hereinafter be described in conjunction with the appended drawings to illustrate and not to limit the disclosure, wherein like designations denote like elements, and variations of the described aspects are not restricted to the specifically shown embodiments, but are applicable on other variations of the disclosure.

Figure 1:
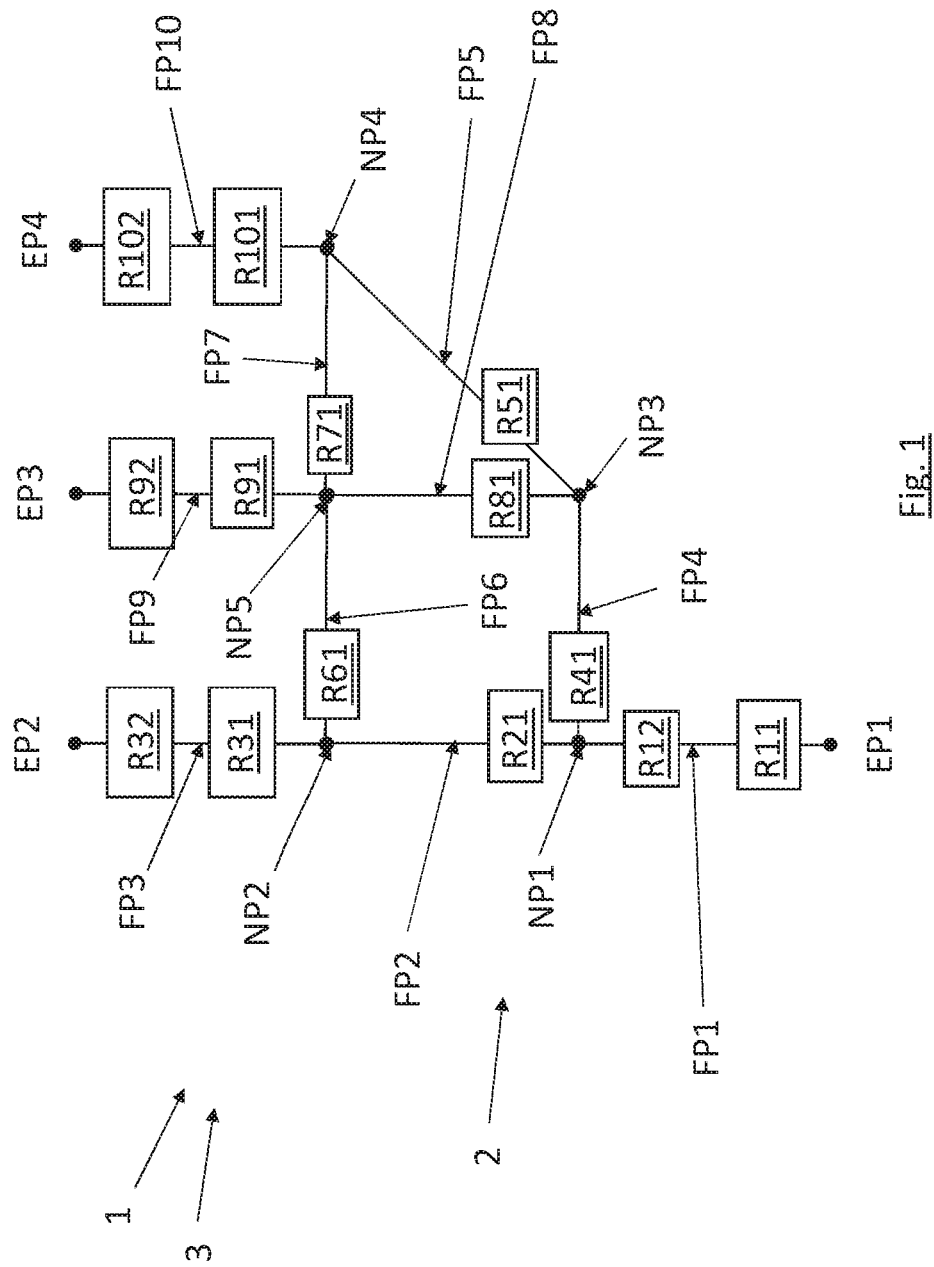
FIG. 1 schematically shows a diagram over a phase sequencing three-phase network according to one example of the invention.

FIG. 1 schematically shows a diagram over a phase sequencing three-phase network according to one example of the invention.

The circuit is a phase sequencing three-phase network 1 comprising a first side connected to a second side via the network 1, characterized in that the network comprises:
  a first feed line section FP1 extending from a first end point EP1 to a first node NP1,
  a second feed line section FP2 extending from the first node NP1 to a second node NP2,
  a third feed line section FP3 extending from the second node NP2 to a second end point EP2,
  a fourth feed line section FP4 extending from the first node NP1 to a third node NP3,
  a fifth feed line section FP5 extending from the third node NP3 to a fourth node NP4,
  a sixth feed line section FP6 extending from the second node NP2 to a fifth node NP5,
  a seventh feed line section FP7 extending from the fifth node NP5 to the fourth node NP4,
  an eighth feed line section FP8 extending from the third node NP3 to the fifth node NP5,
  a ninth feed line section FP9 extending from the fifth node NP5 to a third end point EP3,
  a tenth feed line section FP10 extending from the fourth node NP4 to a fourth end point EP4, wherein the network comprises a first circuit 2 comprising the first, second, fourth, fifth, sixth, seventh and eight feed line sections FP1, FP2, FP4, FP5, FP6, FP7, FP8 between the first endpoint EP1 and the second, fourth and fifth nodes NP2, NP4, NP5, and a second circuit 3 comprising the third feed line section FP3 between the second node NP2 and the second end point EP2, the ninth feed line section FP9 between the fifth node NP5 and the third end point EP3 and the tenth feed line section FP10 between the fourth node NP4 and the fourth end point EP4, and wherein each feed line section in the first circuit 2 and second circuit 3 comprises one or more transmission line sections R11-R102 with a predetermined characteristic impedance and length.

According to one example, the second circuit comprises transmission line sections with predetermined characteristic impedance for adjusting amplitude.

According to one example, the feed line section identified as representing the first phase in the second circuit serves as the reference phase for phase shift on the remaining two feed line sections.

According to one example, the remaining two feed line sections have predetermined lengths with reference to the length of the transmission line section in the reference phase so that the phase angles are substantially 120 degrees between the second, third and fourth end points EP2, EP3 and EP4.

According to one example, the first side comprises the first end point EP1 and the second side comprises the second end point EP2, the third end point EP3 and the fourth end point EP4.

According to one example, the network can be used for both transmitting and receiving and in the transmitting mode the first side is a feeding side for feeding signals to the antenna for transmission via the second side, and in the receiving mode the second side is a receiving side for feeding signals to the first side.

According to one example, the first matching circuit 2 is not terminated.

According to one example, the phase sequencing three-phase network comprises only passive components.

Figure 4:
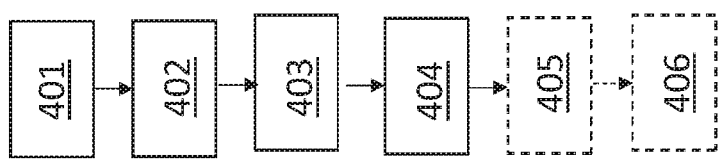
FIG. 4 schematically shows a flowchart of a method for optimizing a phase sequencing three-phase network according to any one of the examples in FIGS. 1-3.

The invention further relates to a method for optimizing a phase sequencing three-phase network 1 according to any one of the examples above and schematically described in FIG. 4 with reference to boxes. The method comprises:

Box 401
 setting a phase and amplitude balance and reflection bandwidth specification on all four end points EP1, EP2, EP3 and EP4.

Box 402
 choosing characteristic impedance on each of the four end points EP1, EP2, EP3 and EP4.

Box 403
 for each of the third, ninth and tenth feed line sections, i.e. the three feed line section connected to the three input/output endpoints, FP3, FP9, FP10 setting characteristic impedance on the transmission line sections R32, R92, R102 closest to their respective second, third and fourth endpoints EP2, EP3, EP4 to be the same as the characteristic impedance of the respective second, third and fourth endpoints EP2, EP3, EP4.

Box 404
 optimize all remaining transmission line sections R11-R101 to achieve the specification.

According to one example, the method further comprises:
Box 405
 finding which of the third, ninth, and tenth feed line section FP3, FP9, FP10 is the first phase.

Box 406
 using the identified feed line section FP9 as a reference phase and adjusting amplitude and phase on the other two feed line sections FP3, FP10 by optimizing characteristic impedance and length on the respective other two transmission line sections R31, R32, R101, R10 with relation to the characteristic impedance and length of the transmission line section R91, R92 of the identified feed line section FP9.

In order to simplify further description of the example in FIG. 1 of the invention the following denotations are introduced:
 the first feed line section FP1 comprises a first transmission line section R11, R12,
 the second feed line section FP2 comprises a second transmission line section R21, R22,
 the third feed line section FP3 comprises a third transmission line section R31, R32,
 the fourth feed line section FP4 comprises a fourth transmission line section R41, R42,
 the fifth feed line section FP5 comprises a fifth transmission line section R51, R52,
 the sixth feed line section FP6 comprises a sixth transmission line section R61, R62,
 the seventh feed line section FP7 comprises a seventh transmission line section R71, R72,
 the eighth feed line section FP8 comprises an eighth transmission line section R81, R82,
 the ninth feed line section FP9 comprises a ninth transmission line section R91, R92, and
 the tenth feed line section FP10 comprises a tenth transmission line section R101, R102.

Here, it should be noted that each feed line section may comprise one or more transmission line sections.

According to the following examples:
 the first transmission line section comprises two transmission line sections hereinafter denoted R11, with a characteristic impedance denoted Z0 and a length denoted L0, and R12, with a characteristic impedance denoted Z1 and a length denoted L1,
 the second transmission line section comprises one transmission line section hereinafter denoted R21 with a characteristic impedance denoted Z2 and a length denoted L2,
 the third transmission line section comprises two transmission line sections hereinafter denoted R31, with a characteristic impedance denoted Z8 and a length denoted L8, and R32, with a characteristic impedance denoted Z11 and a length denoted L11,
 the fourth transmission line section comprises one transmission line section hereinafter denoted R41, with a characteristic impedance denoted Z3 and a length denoted L3,
 the fifth transmission line section comprises one transmission line section hereinafter denoted R51, with a characteristic impedance denoted Z5 and a length denoted L5,
 the sixth transmission line section comprises one transmission line section hereinafter denoted R61, with a characteristic impedance denoted Z6 and a length denoted L6,
 the seventh transmission line section comprises one transmission line section hereinafter denoted R71, with a characteristic impedance denoted Z7 and a length denoted L7, the eighth transmission line section comprises one transmission line section hereinafter denoted R81, with a characteristic impedance denoted Z4 and a length denoted L4, the ninth transmission line section comprises two transmission line sections hereinafter denoted R91, with a characteristic impedance denoted Z9 and a length denoted L9, and R92 with a characteristic impedance denoted Z11 and a length denoted L12, and the tenth transmission line section comprises two transmission line sections hereinafter denoted R101, with a characteristic impedance denoted Z10 and a length denoted L10, and R102 with a characteristic impedance denoted Z11 and a length denoted L13.

In this example and with reference to the above, it is the transmission line section R11 that is that is closest to the first endpoint; the transmission line section R32 that is closest to the second endpoint; the transmission line section R92 that is closest to the third endpoint; and the transmission line section R102 that is closest to the fourth endpoint.

As mentioned above, each of the transmission line sections are associated to a characteristic impedance and a length. Choosing the correct characteristic impedances and lengths of the transmission line sections, Z0 to Z11 and L0 to L13, will result in a broadband feed network. There are several combinations of the parameters Z0 to Z11 and L0 to L13 that lead to good results.

Choosing the following parameters for Z0 to Z11 and L1 to L13 gives a beneficial example of the invention with a broad bandwidth, equal amplitudes and three phases divided equally around 360 degrees, i.e. 0, 120 and 240 degrees. The length L is given as electrical length in degrees at the center frequency. In this example the input and output characteristic impedance is 50 Ohm.

R11: Z0=50 Ohm and L0=10 degree,
R12: Z1=50 Ohm and L1=10 degree,
R21: Z2=100 Ohm and L2=62 degree,
R41: Z3=40 Ohm and L3=106 degree,
R81: Z4=55 Ohm and L4=169 degree,
R51: Z5=40 Ohm and L5=171 degree,
R61: Z6=45 Ohm and L6=140 degree,
R71: Z7=100 Ohm and L7=87 degree,
R31: Z8=70 Ohm and L8=125 degree,
R91: Z9=30 Ohm and L9=29 degree, R101: Z10=35 Ohm and L10=149 degree, R32: Z11=50 Ohm and L11=9 degree, R92: Z11=50 Ohm and L12=50 degree, R102: Z11=50 Ohm and L13=28 degree.

Below are further examples of how the components can be matched in order to achieve a phase sequencing three-phase network where the phase angles are substantially 120 degrees between the second, third and fourth end points EP2, EP3 and EP4.

In the following table each column represents an example and there are nine examples, i.e. example Ex. 1 to Ex. 9.

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Z0 | 50 | 50 | 50 | 50 | 50 | 50 | 50 | 50 | 50 |
| Z1 | 50 | 50 | 50 | 50 | 50 | 50 | 50 | 50 | 50 |
| Z2 | 100 | 50 | 64 | 100 | 70 | 50 | 48 | 53 | 99 |
| Z3 | 54 | 100 | 79 | 61 | 47 | 78 | 95 | 97 | 45 |
| Z4 | 52 | 56 | 100 | 99 | 99 | 62 | 100 | 60 | 40 |
| Z5 | 79 | 30 | 48 | 100 | 98 | 86 | 30 | 37 | 100 |
| Z6 | 89 | 30 | 35 | 39 | 100 | 30 | 30 | 32 | 68 |
| Z7 | 36 | 100 | 56 | 30 | 55 | 100 | 58 | 98 | 39 |
| Z8 | 75 | 87 | 77 | 74 | 82 | 87 | 100 | 99 | 67 |
| Z9 | 53 | 85 | 81 | 30 | 42 | 86 | 100 | 100 | 53 |
| Z10 | 98 | 43 | 43 | 33 | 38 | 30 | 43 | 32 | 100 |
| Z11 | 50 | 50 | 50 | 50 | 50 | 50 | 50 | 50 | 50 |
| L0 | 10 | 10 | 10 | 10 | 10 | 10 | 10 | 10 | 10 |
| L1 | 10 | 10 | 10 | 10 | 10 | 10 | 10 | 10 | 10 |
| L2 | 130 | 72 | 52 | 94 | 147 | 58 | 72 | 68 | 99 |
| L3 | 74 | 113 | 112 | 199 | 38 | 100 | 106 | 113 | 84 |
| L4 | 200 | 173 | 154 | 48 | 38 | 160 | 155 | 166 | 200 |
| L5 | 60 | 51 | 23 | 126 | 163 | 13 | 35 | 41 | 60 |
| L6 | 139 | 200 | 199 | 125 | 123 | 184 | 186 | 182 | 136 |
| L7 | 200 | 80 | 134 | 21 | 32 | 133 | 135 | 122 | 200 |
| L8 | 70 | 174 | 167 | 136 | 200 | 178 | 172 | 171 | 105 |
| L9 | 123 | 170 | 166 | 45 | 76 | 172 | 171 | 170 | 148 |
| L10 | 16 | 70 | 28 | 179 | 174 | 19 | 99 | 10 | 13 |
| L11 | 144 | 115 | 115 | 18 | 192 | 102 | 110 | 109 | 156 |
| L12 | 50 | 50 | 50 | 50 | 50 | 50 | 50 | 50 | 50 |
| L13 | 80 | 45 | 102 | 25 | 79 | 119 | 38 | 110 | 108 |

In the following table each column represents an example and there are nine examples, i.e. example Ex. 1 to Ex. 9. Some of the characteristic impedances Z and the lengths L are expressed as an interval. Hence, in this example some of the characteristic impedances and lengths are set to predetermined numbers, while other characteristic impedances and lengths are set to intervals.

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Z0 | 50 | 50 | 50 | 50 | 50 | 50 | 50 | 50 | 50 |
| Z1 | 50 | 50 | 50 | 50 | 50 | 50 | 50 | 50 | 50 |
| Z2 | 100 | 30-100 | 30-100 | 30-100 | 30-100 | 30-100 | 30-100 | 30-100 | 30-100 |
| Z3 | 30-100 | 100 | 30-100 | 30-100 | 30-100 | 30-100 | 30-100 | 30-100 | 30-100 |
| Z4 | 30-100 | 30-100 | 100 | 30-100 | 30-100 | 30-100 | 30-100 | 30-100 | 30-100 |
| Z5 | 30-100 | 30-100 | 30-100 | 100 | 30-100 | 30-100 | 30-100 | 30-100 | 30-100 |
| Z6 | 30-100 | 30-100 | 30-100 | 30-100 | 100 | 30-100 | 30-100 | 30-100 | 30-100 |
| Z7 | 30-100 | 30-100 | 30-100 | 30-100 | 30-100 | 100 | 30-100 | 30-100 | 30-100 |
| Z8 | 30-100 | 30-100 | 30-100 | 30-100 | 30-100 | 30-100 | 100 | 30-100 | 30-100 |
| Z9 | 30-100 | 30-100 | 30-100 | 30-100 | 30-100 | 30-100 | 30-100 | 100 | 30-100 |
| Z10 | 30-100 | 30-100 | 30-100 | 30-100 | 30-100 | 30-100 | 30-100 | 30-100 | 100 |
| Z11 | 50 | 50 | 50 | 50 | 50 | 50 | 50 | 50 | 50 |
| L0 | 10 | 10 | 10 | 10 | 10 | 10 | 10 | 10 | 10 |
| L1 | 10 | 10 | 10 | 10 | 10 | 10 | 10 | 10 | 10 |
| L2 | 10-200 | 10-200 | 10-200 | 10-200 | 10-200 | 10-200 | 10-200 | 10-200 | 10-200 |
| L3 | 10-200 | 10-200 | 10-200 | 10-200 | 10-200 | 10-200 | 10-200 | 10-200 | 10-200 |
| L4 | 10-200 | 10-200 | 10-200 | 10-200 | 10-200 | 10-200 | 10-200 | 10-200 | 10-200 |
| L5 | 10-200 | 10-200 | 10-200 | 10-200 | 10-200 | 10-200 | 10-200 | 10-200 | 10-200 |
| L6 | 10-200 | 10-200 | 10-200 | 10-200 | 10-200 | 10-200 | 10-200 | 10-200 | 10-200 |
| L7 | 10-200 | 10-200 | 10-200 | 10-200 | 10-200 | 10-200 | 10-200 | 10-200 | 10-200 |
| L8 | 10-200 | 10-200 | 10-200 | 10-200 | 10-200 | 10-200 | 10-200 | 10-200 | 10-200 |
| L9 | 10-200 | 10-200 | 10-200 | 10-200 | 10-200 | 10-200 | 10-200 | 10-200 | 10-200 |
| L10 | 10-200 | 10-200 | 10-200 | 10-200 | 10-200 | 10-200 | 10-200 | 10-200 | 10-200 |
| L11 | 10-200 | 10-200 | 10-200 | 10-200 | 10-200 | 10-200 | 10-200 | 10-200 | 10-200 |
| L12 | 50 | 50 | 50 | 50 | 50 | 50 | 50 | 50 | 50 |
| L13 | 10-200 | 10-200 | 10-200 | 10-200 | 10-200 | 10-200 | 10-200 | 10-200 | 10-200 |

The transmission line sections can be made from one type of transmission line or a combination of different types. The transmission line can for example be a stripline, microstrip, coaxial cable or a waveguide.

Figure 2:
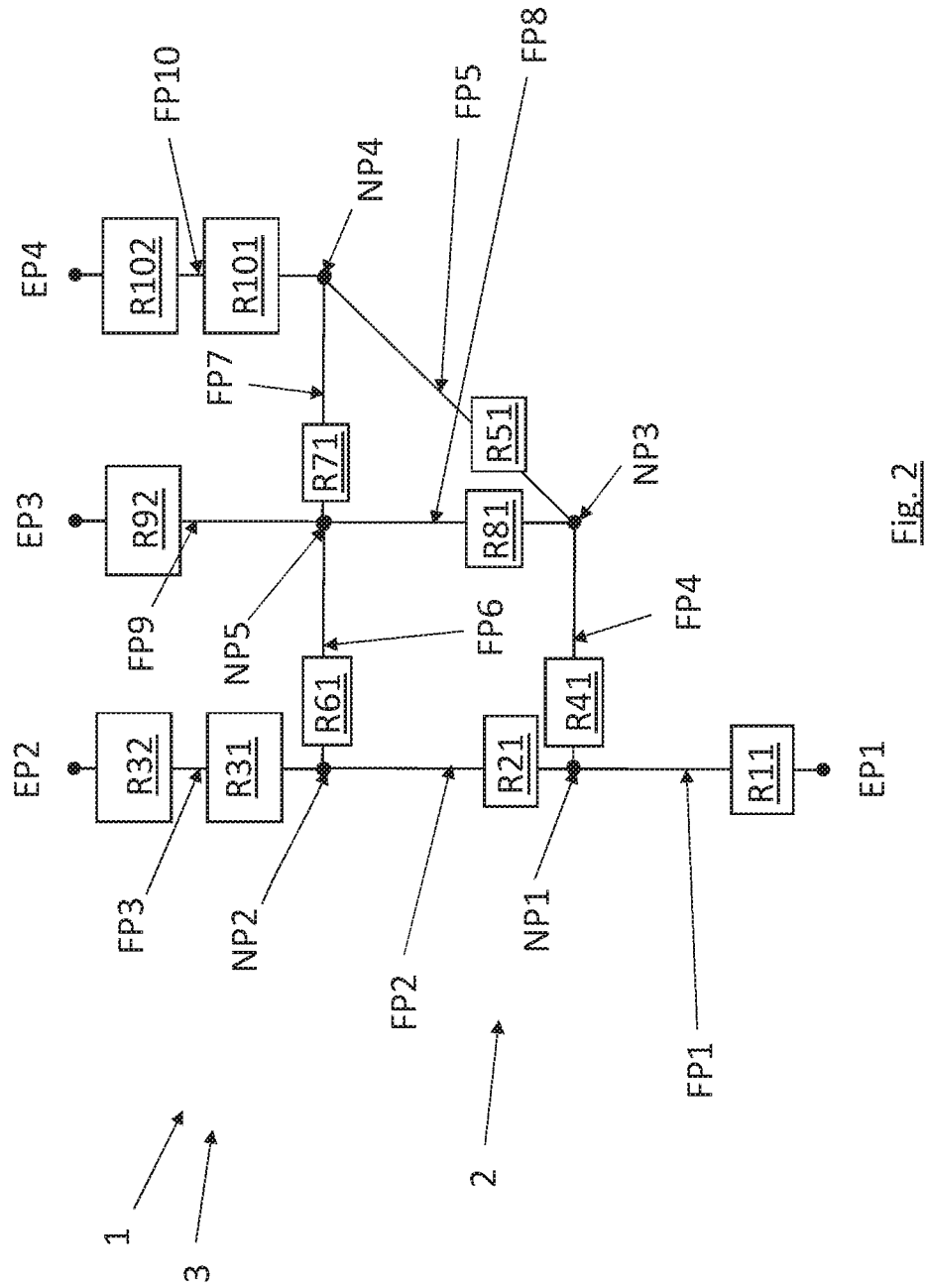
FIG. 2 schematically shows a diagram over a phase sequencing three-phase network according to one example of the invention.
Figure 3:
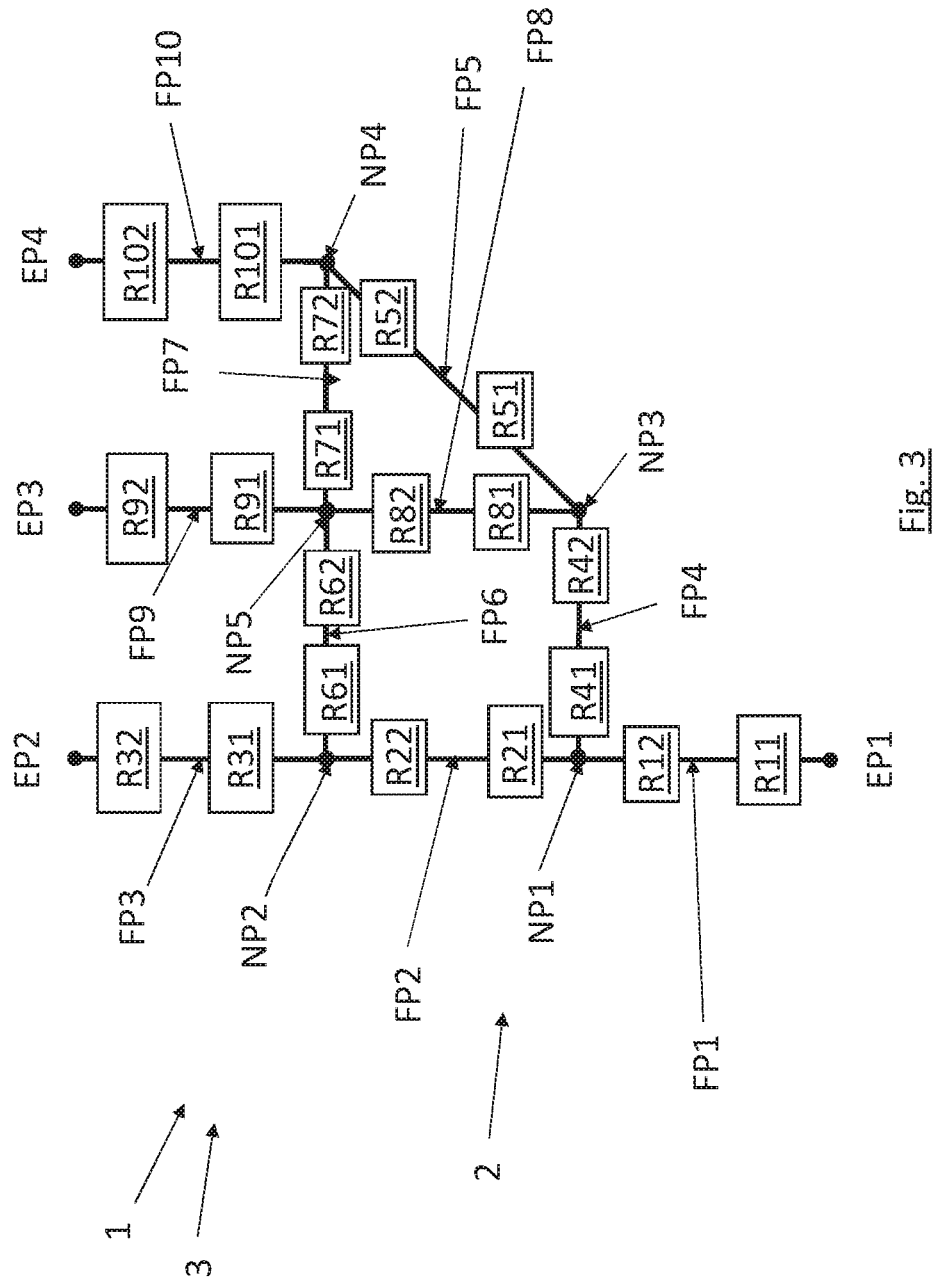
FIG. 3 schematically shows a diagram over a phase sequencing three-phase network according to one example of the invention.

FIGS. 2 and 3 schematically shows diagrams over a phase sequencing three-phase network according to two examples of the invention. FIGS. 2 and 3 show that the network comprises the same feed line sections as in FIG. 1, but with the illustrative example that each feed line section can comprise fewer or more feed line sections, with the same result as described in connection to FIG. 1. Hence, the characteristic impedance and length described in connection to FIG. 1 can be achieved with one or more transmission line sections per feed line section.

FIG. 2 shows that:
the first transmission line section comprises one transmission line section R11,
the second transmission line section comprises one transmission line section R21,
the third transmission line section comprises two transmission line sections R31 and R32,
the fourth transmission line section comprises one transmission line section R41,
the fifth transmission line section comprises one transmission line section R51,
the sixth transmission line section comprises one transmission line section R61,
the seventh transmission line section comprises one transmission line section R71,
the eighth transmission line section comprises one transmission line section R81,
the ninth transmission line section comprises one transmission line section R91,
the tenth transmission line section comprises two transmission line sections R101 and R102.

The example in FIG. 2 schematically shows that the ninth feed line section FP9 has been identified as the first phase and used as a reference phase. The third feed line section FP3 and the tenth feed line section FP10 are then adjusted for amplitude and phase by optimizing characteristic impedance and length on the respective two transmission line sections R31, R32, R101, R10 with relation to the characteristic impedance and length of the transmission line section R91, R92 of the identified feed line section FP9.

FIG. 3 shows that:
the first transmission line section comprises two transmission line sections R11 and R12,
the second transmission line section comprises two transmission line sections R21 and R22,
the third transmission line section comprises two transmission line sections R31 and R32,
the fourth transmission line section comprises two transmission line sections R41 and R42,
the fifth transmission line section comprises two transmission line sections R51 and R52,
the sixth transmission line section comprises two transmission line sections R61 and R62,
the seventh transmission line section comprises two transmission line sections R71 and R72,
the eighth transmission line section comprises two transmission line sections R81 and R82,
the ninth transmission line section comprises two transmission line sections R91 and R92,
the tenth transmission line section comprises two transmission line sections R101 and R102.

The invention is not limited to the examples, but it should be noted that the circuit structure with its endpoints, feed line sections and nodes is crucial for the invention and that the characteristic impedance and lengths of the transmission line sections can be built up different than was described above.

What is claimed is:

1. A phase sequencing three-phase network comprising a first side connected to a second side via the network, characterized in that the network comprises:
a first feed line section (FP1) extending from a first end point (EP1) to a first node (NP1), wherein the first side comprises the first end point (EP1) and the second side comprises a second end point (EP2), a third end point (EP3), and a fourth end point (EP4),
a second feed line section (FP2) extending from the first node (NP1) to a second node (NP2),
a third feed line section (FP3) extending from the second node (NP2) to the second end point (EP2),
a fourth feed line section (FP4) extending from the first node (NP1) to a third node (NP3),
a fifth feed line section (FP5) extending from the third node (NP3) to a fourth node (NP4),
a sixth feed line section (FP6) extending from the second node (NP2) to a fifth node (NP5),
a seventh feed line section (FP7) extending from the fifth node (NP5) to the fourth node (NP4),
an eighth feed line section (FP8) extending from the third node (NP3) to the fifth node (NP5),
a ninth feed line section (FP9) extending from the fifth node (NP5) to the third end point (EP3),
a tenth feed line section (FP10) extending from the fourth node (NP4) to the fourth end point (EP4),
wherein the seventh feed line section (FP7) is different from the fifth feed line section (FP5) and the eighth feed line section (FP8) and extends directly from the fifth node (NP5) to the fourth node (NP4),
wherein the network comprises a first circuit comprising the first, second, fourth, fifth, sixth, seventh and eight feed line sections (FP1, FP2, FP4, FP5, FP6, FP7, FP8) between the first endpoint (EP1) and the second, fourth and fifth nodes (NP2, NP4, NP5),
wherein the network comprises a second circuit comprising the third feed line section (FP3) between the second node (NP2) and the second end point (EP2), the ninth feed line section (FP9) between the fifth node (NP5) and the third end point (EP3) and the tenth feed line section (FP10) between the fourth node (NP4) and the fourth end point (EP4),
wherein each feed line section in the first circuit and second circuit comprises one or more transmission line sections (R11-R102) with a predetermined characteristic impedance and length, and
wherein the predetermined characteristic impedance and the length of each of the one or more transmission line sections is selected such that the phase sequencing three-phase network has phase angles of substantially 120 degrees between the second, third, and the fourth end points (EP2, EP3, EP4).

2. The phase sequencing three-phase network according to claim 1, wherein the second circuit comprises transmission line sections (R31, R32, R91, R92, R101, R102) with the predetermined characteristic impedance for adjusting amplitude of an input signal to the three-phase network.

3. The phase sequencing three-phase network according to claim 1, wherein the feed line section (FP3, FP9, FP10) identified as representing the first phase in the second circuit serves as a reference phase for phase shift on remaining two feed line sections (FP3, FP9, FP10).

4. The phase sequencing three-phase network according to claim 3, wherein the remaining two feed line sections (FP3, FP9, FP10) have predetermined lengths with reference to the length of the transmission line section in the reference phase so that the phase angles are substantially 120 degrees between the second, third and fourth end points (EP2, EP3 and EP4).

5. The phase sequencing three-phase network according to claim 1, wherein in a transmitting mode the first side is a feeding side for feeding signals to an antenna for transmission via the second side, and wherein in a receiving mode the second side is a receiving side for feeding signals to the first side.

6. The phase sequencing three-phase network according to claim 1, wherein the first feed line section (FP1) comprises a first transmission line section (R11, R12), the second feed line section (FP2) comprises a second transmission line section (R21, R22), the third feed line section (FP3) comprises a third transmission line section (R31, R32), the fourth feed line section (FP4) comprises a fourth transmission line section (R41, R42), the fifth feed line section (FP5) comprises a fifth transmission line section (R51, R52), the sixth feed line section (FP6) comprises a sixth transmission line section (R61, R62), the seventh feed line section (FP7) comprises a seventh transmission line section (R71, R72), the eight feed line section (FP8) comprises an eight transmission line section (R81, R82), the ninth feed line section (FP9) comprises a ninth transmission line section (R91, R92) and the tenth feed line section (FP10) comprises a tenth transmission line section (R101, R102).

7. A method for optimizing a phase sequencing three-phase network comprising a first side connected to a second side via the network, characterized in that the network comprises:
a first feed line section (FP1) extending from a first end point (EP1) to a first node (NP1), wherein the first side comprises the first end point (EP1) and the second side comprises a second end point (EP2), a third end point (EP3), and a fourth end point (EP4),
a second feed line section (FP2) extending from the first node (NP1) to a second node (NP2),
a third feed line section (FP3) extending from the second node (NP2) to lathe second end point (EP2),
a fourth feed line section (FP4) extending from the first node (NP1) to a third node (NP3),
a fifth feed line section (FP5) extending from the third node (NP3) to a fourth node (NP4),
a sixth feed line section (FP6) extending from the second node (NP2) to a fifth node (NP5),
a seventh feed line section (FP7) extending from the fifth node (NP5) to the fourth node (NP4),
an eighth feed line section (FP8) extending from the third node (NP3) to the fifth node (NP5),
a ninth feed line section (FP9) extending from the fifth node (NP5) to the third end point (EP3),
a tenth feed line section (FP10) extending from the fourth node (NP4) to the fourth end point (EP4),
wherein the seventh feed line section (FP7) is different from the fifth feed line section (FP5) and the eighth feed line section (FP8) and extends directly from the fifth node (NP5) to the fourth node (NP4),
wherein the network comprises a first circuit comprising the first, second, fourth, fifth, sixth, seventh and eight feed line sections (FP1, FP2, FP4, FP5, FP6, FP7, FP8) between the first endpoint (EP1) and the second, fourth and fifth nodes (NP2, NP4, NP5),
wherein the network comprises a second circuit comprising the third feed line section (FP3) between the second node (NP2) and the second end point (EP2), the ninth feed line section (FP9) between the fifth node (NP5) and the third end point (EP3) and the tenth feed line section (FP10) between the fourth node (NP4) and the fourth end point (EP4),
wherein each feed line section in the first circuit and second circuit comprises one or more transmission line sections (R11-R102) with a predetermined characteristic impedance and length, and
wherein further comprises:
setting a phase and amplitude balance and reflection bandwidth specification on the end points (EP1, EP2, EP3 and EP4),
choosing characteristic impedance on the end points (EP1, EP2, EP3 and EP4),
for each of the third, ninth and tenth feed line sections (FP3, FP9, FP10) setting characteristic impedance on the transmission line sections (R32, R92, R102) closest to their respective second, third and fourth endpoints (EP2, EP3, EP4) to be the same as the characteristic impedance of the respective second, third and fourth endpoints (EP2, EP3, EP4), and
optimize at least the characteristic impedances of all remaining transmission line sections (R11-R101), phase and amplitude balance and reflection bandwidth specification is achieved such that the phase sequencing three-phase network has phase angles of substantially 120 degrees between the second, third, and the fourth end points (EP2, EP3, EP4).

8. The method according to claim 7, wherein the method further comprises:
finding which of the third, ninth, and tenth feed line section (FP3, FP9, FP10) is the first phase,
using the identified feed line section (FP9) as a reference phase and adjusting amplitude and phase on the other two feed line sections (FP3, FP10) by optimizing characteristic impedance and length on the respective other two transmission line sections (R31, R32, R101, R10) with relation to the characteristic impedance and length of the transmission line section (R91, R92) of the identified feed line section (FP9).

* * * * *